(12) United States Patent
McCarthy, Jr.

(10) Patent No.: US 6,636,569 B1
(45) Date of Patent: Oct. 21, 2003

(54) NYQUIST BAND FREQUENCY TRANSLATION

(75) Inventor: Michael McCarthy, Jr., Waterford (IE)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/510,807

(22) Filed: Feb. 23, 2000

(30) Foreign Application Priority Data

Feb. 25, 1999 (EP) .............................................. 99301398

(51) Int. Cl.[7] .............................................. H04L 27/06
(52) U.S. Cl. ...................................................... 375/316
(58) Field of Search ............................... 375/260, 316, 375/340, 350, 259, 295, 296, 285, 346, 355

(56) References Cited

U.S. PATENT DOCUMENTS

| | | | |
|---|---|---|---|
| 4,852,129 A | * | 7/1989 | Schwartz .................... 375/240 |
| 5,422,909 A | | 6/1995 | Love et al. .................. 375/200 |
| 5,602,847 A | | 2/1997 | Pagano et al. ............... 370/484 |
| 5,732,337 A | | 3/1998 | Wargnier et al. ........... 455/144 |

FOREIGN PATENT DOCUMENTS

WO    WO 97/05705    2/1997    ............ H04B/1/26

OTHER PUBLICATIONS

European Search Report, dated Aug. 5, 1999.

* cited by examiner

*Primary Examiner*—Tesfaldet Bocure

(57) ABSTRACT

There is disclosed a method of processing a signal which comprises sampling the signal at a sampling frequency. Discrete time components at the sampling interval are thereby generated. Inverting alternate ones of the discrete time components thereby translates a frequency component of the sampled signal in one part of the Nyquist band to another part of the Nyquist band. The step of inverting alternate ones of the discrete time components is shown to comprise multiplying the sampled signal by a reference signal at half the sampling frequency and having discrete time components at the sampling interval. Circuitry for implementing the method is also disclosed.

12 Claims, 6 Drawing Sheets

NYQUIST BAND FREQUENCY TRANSLATION

CROSS-REFERENCE TO RELATED APPLICATION

This application claims priority of European Patent Application No. 99301398.6 which was filed on Feb. 25, 1999.

FIELD OF THE INVENTION

The present invention relates to the translation of frequencies within the Nyquist sampling band, and particularly but not exclusively to the translation of frequencies in a receiver or transmitter of a communication system.

BACKGROUND TO THE INVENTION

The emergence of software defined radio, where the transmitter and receiver are implemented digitally, as a feasible alternative to the conventional Armstrong superheterodyne approach has seen the migration of more and more of the receiver's architecture to the discrete digital domain.

In a multi-carrier communication system a filter is required for each carrier frequency used by the system. Each filter has a centre frequency located in the Nyquist band, which is the portion of the sampled frequency spectrum located below half the sampling frequency. As the number of carrier frequencies, or channels, required to be supported by a communication system increases, the number of filters required to have different centre frequencies in the Nyquist band increases. Obviously, the frequency spectrum in the Nyquist band is fixed for a given sampling rate. Therefore to ensure correct operation of the communication system as the number of carrier frequencies used increases the design of the filters used must have a very precise bandwidth with accurately defined lower and upper cut-off frequencies.

The trend towards implementation of the transmitter and the receiver in the digital domain, coupled with ever-increasing bandwidths of interest, results for demands for increased flexibility in circuitry which provides the analogue to digital and digital to analogue domain conversion.

The cost of the circuitry thus increases owing to the need to provide a number of highly tuned filters at different centre frequencies. It is therefore desirable to provide means that minimise the circuitry necessary in implementing the filters.

It is therefore an object of the present invention to provide a signal processing means which results in the provision of an efficient filtering circuitry.

SUMMARY OF THE INVENTION

According to the present invention there is provided a method of processing a signal, comprising sampling the signal at a sampling frequency thereby generating discrete time components at the sampling interval; and inverting alternate ones of the discrete time components thereby translating a frequency component of the sampled signal in one part of the Nyquist band to another part of the Nyquist band.

The step of inverting alternate ones of the discrete time components may comprise multiplying the sampled signal by a reference signal at half the sampling frequency and having discrete time components at the sampling interval.

A frequency component in the upper half of the Nyquist band may be translated to a lower half of the Nyquist band or a frequency component in the lower half of the Nqyquist band may be translated to the upper half of the Nyquist band The method may further comprise the step of selectively enabling the inverting step. The inverting step may be selectively enabled responsive to the frequency of the sampled signal being in a certain range. Each of the plurality of signals may have a frequency within the Nyquist band, and the step of inverting may be carried out selectively for the plurality of sampled signals, whereby the frequency components of selected ones of the signals are translated to another part of the Nyquist band.

Those signals having frequencies in the upper half of the Nyquist band may be translated to the lower half of the Nyquist band or those signals having frequencies in the lower half of the Nyquist band may be translated to the upper half of the Nyquist band.

The invention also provides a signal processing circuit comprising an input circuit connected to receive a signal; a sampling circuit connected to the input circuit and for sampling the signal at a sampling frequency to thereby generate discrete time components at the sampling interval; and inverting means connected to receive the sampled output and for inverting alternate ones of the discrete time components, whereby a frequency component of the sampled signal in one part of the Nyquist band is translated to another part of the Nyquist band.

The means for inverting may comprise a multiplier connected to multiply the sampled signal by a reference signal at half the sampling frequency and having discrete time components at the sampling interval.

A frequency component in the upper half of the Nyquist band may be translated to a lower half of the Nyquist band and a frequency component in the lower half of the Nqyquist band may be translated to the upper half of the Nyquist band The signal processing circuit may further comprise a selection circuit for selectively enabling the means for inverting. The means for inverting may be selectively enabled responsive to the frequency of the sampled signal being in a certain range.

The input circuit may be connected to receive a plurality of signals having different frequencies, each of the plurality of signals having a frequency within the Nyquist band, wherein the inverting means is enabled selectively such that frequency components of selected ones of the signals are translated to another part of the Nyquist band.

Those signals having frequencies in the upper half of the Nyquist band may be translated to the lower half of the Nyquist band or those signals having frequencies in the lower half of the Nyquist band may be translated to the upper half of the Nyquist band.

DESCRIPTION OF PREFERRED EMBODIMENT

Figure 1:
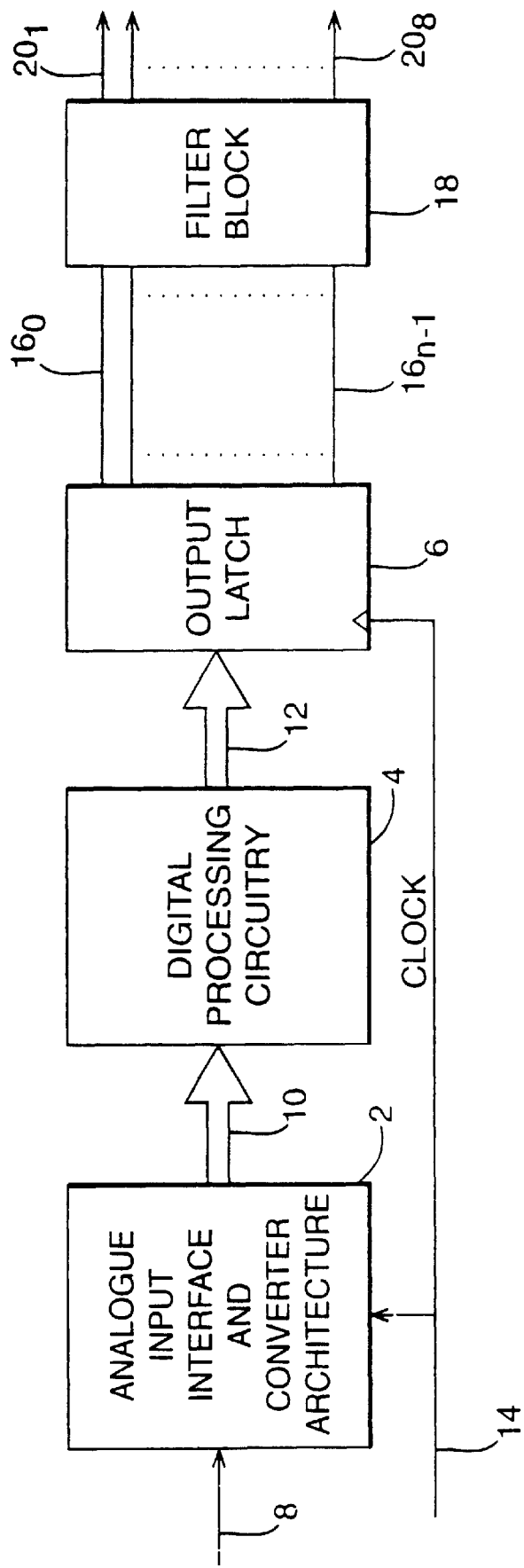
FIG. 1 illustrates the basic elements of part of the signal processing circuitry in an exemplary receiver.

Referring to FIG. 1 there is shown a possible implementation of a conventional analogue-to-digital converter output stage, such as may be found in the receiver of either a mobile station or base station of a mobile communication system. The analogue-to-digital converter includes an analogue input interface and converter architecture block 2, a digital processing circuitry block 4, and an output latch 6. The receiver also includes a filter block 18.

The received signal is presented on line 8 to the analogue input interface and converter architecture block 2 where it is converted into a digital received signal and output on lines 10 to the digital processing circuitry. After digital processing, the processed digital signal is output on lines 12 to the output latch 6, and supplied to the filter stage 18. The analogue input interface and converter architecture 2, and the output latch 6, are both clocked under the control of a clock signal CLOCK on line 14. The clock signal CLOCK thus sets the sampling frequency of the system.

The output latch 6 generates digital signals on a plurality of lines 16a to 16n. At any clock sample, the value on the plurality of signal lines 16 represent an input analogue value.

Thus the lines $16_0$ to $16_{n-1}$ are grouped together to allow the representation of incoming signal levels with a resolution of $2^n$ discrete amplitudes. If there is more than one incoming signal, then the sampled value on the lines $16_0$ to $16_n$ is the sum of all the incoming signals at that point in time. It is the job of the subsequent filter, as described below, to recover the required signal from all of the incoming values.

In the present example it is assumed that there are eight possible carrier frequencies, and the filter stage 18 therefore includes eight filters each associated with one of the eight carrier frequencies, and each connected to receive the digital value on the signal lines $16_0$ to $16_{n-1}$. Each of the filters in the filter block 18 outputs a filtered digital signal on one of the filter block outputs $20_1$ to $20_8$. Each of the filters in the filter block 18 outputs an n bit digital signal, corresponding to the n bit digital signal on the plularity of lines 16. Thus each of the filter block outputs $20_1$ to $20_8$ comprises n signal lines.

Figure 2:
FIG. 2 illustrates the potential frequency spectrum of the filters in the signal processing circuitry of FIG. 1.

Each of the carrier frequencies must, to satisfy Nyquist's sampling criteria, be less than half the sampling frequency of the digitised received waveform. Thus the centre frequencies of each of the eight filters in the filter block 18 must be within the Nyquist band, the Nyquist band being the frequency spectrum below half the sampling frequency. FIG. 2 illustrates the allocation of the filter frequency characteristics for the eight filters in the filter block 18. The frequencies $f_{c1}$ to $f_{c8}$ represent the centre frequencies of each of the eight filters, and the frequency $f_s$ is the sampling frequency.

As can be appreciated from FIG. 2, the upper and lower cut-off frequencies must be very well-defined for each of the filters in the filter block. Each of the eight filters must be very well-defined, and thus eight highly tuned filters are required. The number of filters required is of course defined by the number of possible carrier frequencies, and may be more than eight. Thus as the number of carrier frequencies increases the cost and design complexity of the receiver increases.

Figure 3A:
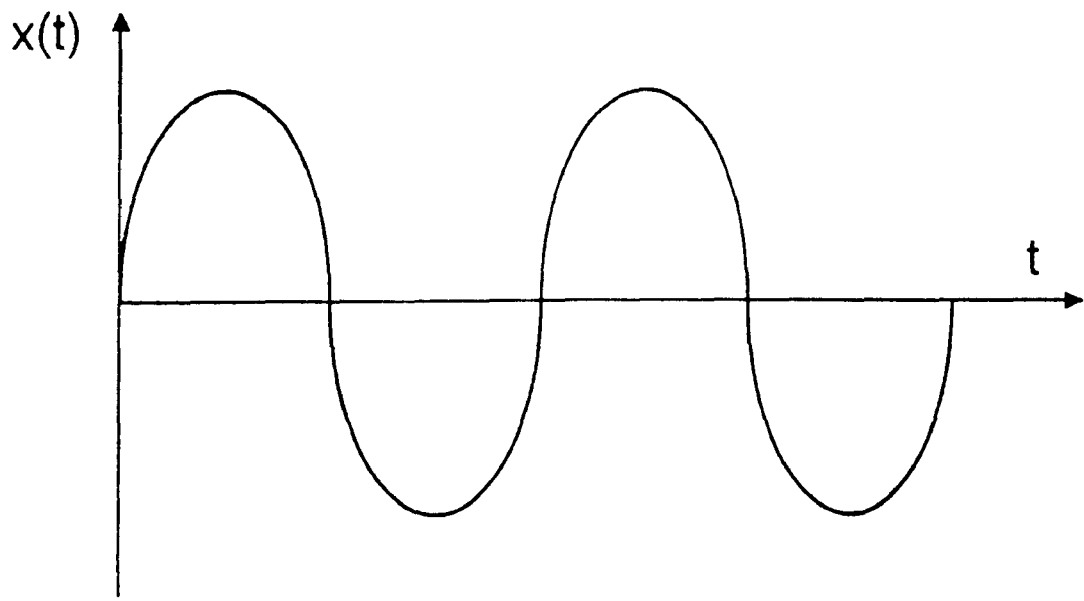
FIGS. 3(a) and (b) illustrate the time and frequency representations of a continuous signal.
Figure 3B:
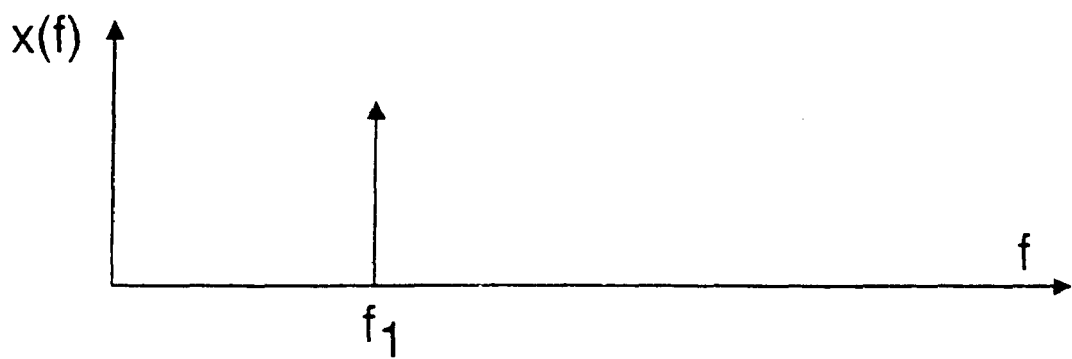

FIG. 3(a) illustrates a continuous signal x(t) of a frequency $f_1$ in the time domain, where $x(t)=\cos(2.\pi.f_1.t)$. The same signal x(t) in the frequency domain may be represented as shown in FIG. 3(b) by a single frequency component at a frequency $f_1$.

Figure 4A:
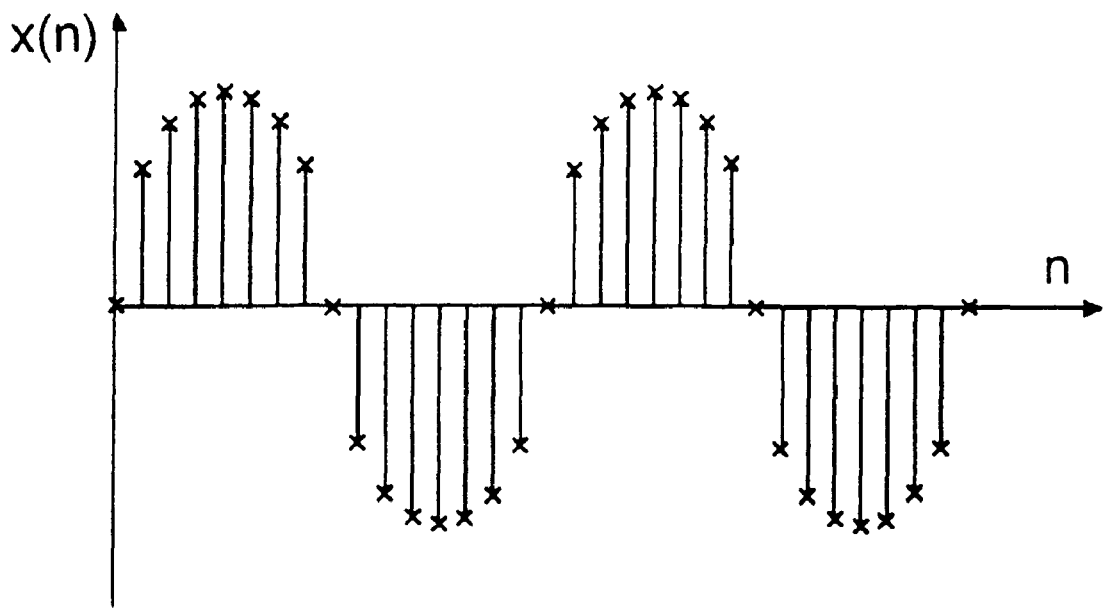
FIGS. 4(a) and (b) illustrate the time and frequency representations of the discrete versions of the signals of FIGS. 3(a) and (b)
Figure 4B:
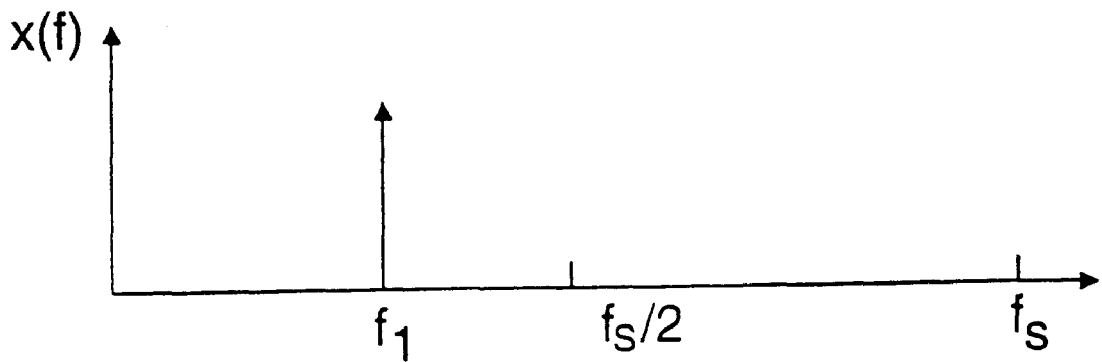
Figure 5:
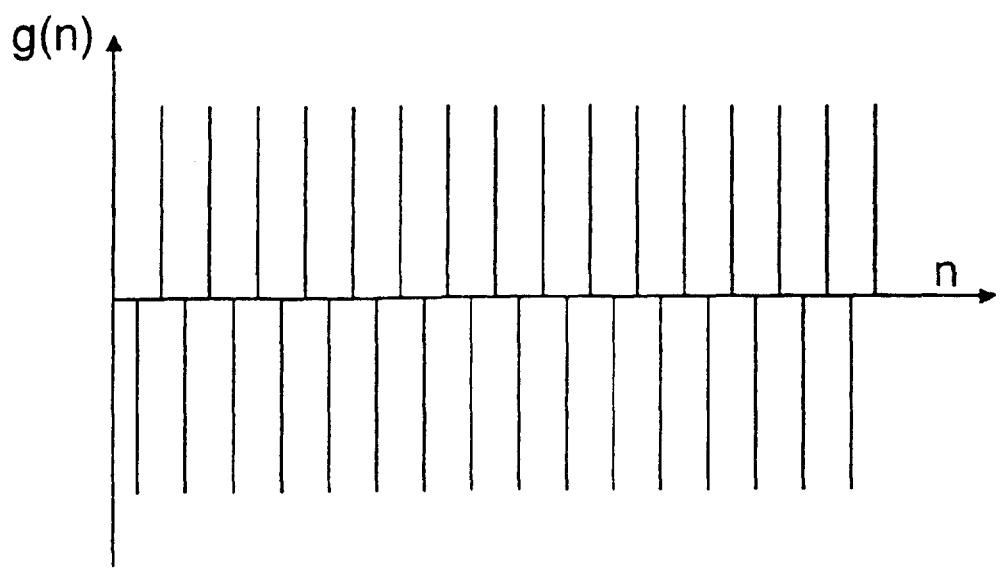
FIG. 5 illustrates a discrete time domain signal at a frequency of half the sampling rate of th signal of FIGS. 4(a) and (b)

Converting the signal x(t) to the discrete time domain, utilising an analogue-to-digital converter at a sampling frequency $f_s$ yields a function x(n) having a time domain response as shown in FIG. 4(a), where $x(n)=\cos(2.\pi.f_1.n)$. The frequency response of the signal x(n), X(f), is shown in FIG. 4(b). As shown in FIG. 4(a) the frequency response X(f) of the signal x(n) is a single frequency component at the frequency $f_1$. The sampling frequency $f_s$, is chosen to satisfy the Nyquist criteria, namely that $f_s$ must be greater than twice the frequency $f_1$ of the signal being sampled. This relationship is illustrated in FIG. 4(b). FIG. 5 illustrates a discrete time domain signal g(n), where $g(n)=\cos(2.\pi.f_s/2.n)$. Thus the signal g(n) has a frequency of half the sampling frequency $f_s$.

Figure 6A:
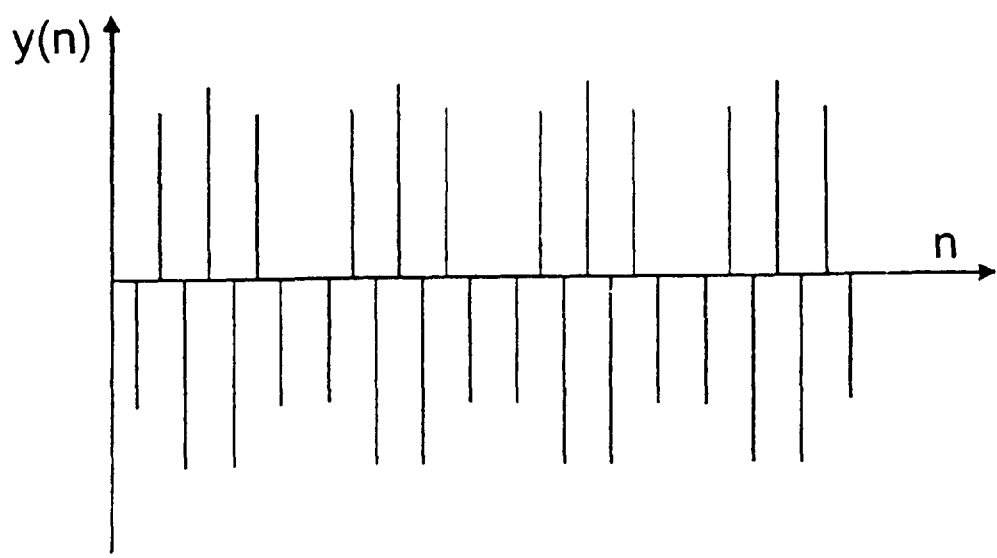
FIGS. 6(a) to (d) illustrate time and frequency domain representations of a signal created by multiplying the signals of FIG. 4(a) and FIG. 5.

Multiplying, in the time domain, the signal x(n) by the signal g(n) results in the discrete time domain signal y(n) shown in FIG. 6(a). The effect of the time domain multiplication of the signal x(n) by the signal g(n), as shown in FIG. 6(a), is to invert every other sample of the signal x(n).

Figure 6B:
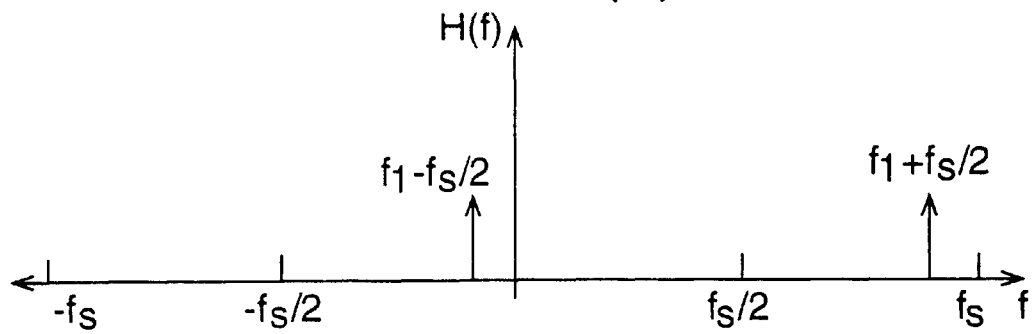

Using the trigonometric identity $\cos A.\cos B=0.5[\cos(A+B)+\cos(A-B)]$, we can expand the time domain multiplication of x(n) and g(n) to give:

$y(n)=[\cos(2.\pi.f_1.n)].[\cos(2.\pi.f_s/2.n)]$ $=0.5\cos(2.\pi.f_1.n+2.\pi.f_s/2.n)+0.5\cos(2.\pi.f_1.n31\ 2.\pi.f_s/2.n)$ $=0.5\cos(2.\pi(f_1+f_s/2).n+0.5\cos(2.\pi.(f_1-f_s/2).n)$ Thus it can be seen that multiplying x(n) and y(n) in the time domain creates sum and difference frequency components in the frequency domain, and realises the discrete frequency spectrum H(f) as shown in FIG. 6(b). As seen in FIG. 6(b), the frequency spectrum has two frequency components, one at a frequency $(f_1-f_s/2)$ and one at a frequency $(f_1+f_s/2)$. As is seen in FIG. 6(b) the frequency $(f_1+f_s/2)$ is outside the Nyquist range and will therefore be aliased back into the Nyquist range to a frequency of $(f_s-(f_1+f_s/2))$, which equates to a frequency of $(f_s/2-f_1)$. Thus the frequency components generated by the multiplication of x(n) and g(n) in the time domain may be represented in the frequency domain as shown in FIG. 6(c).

Figure 6C:
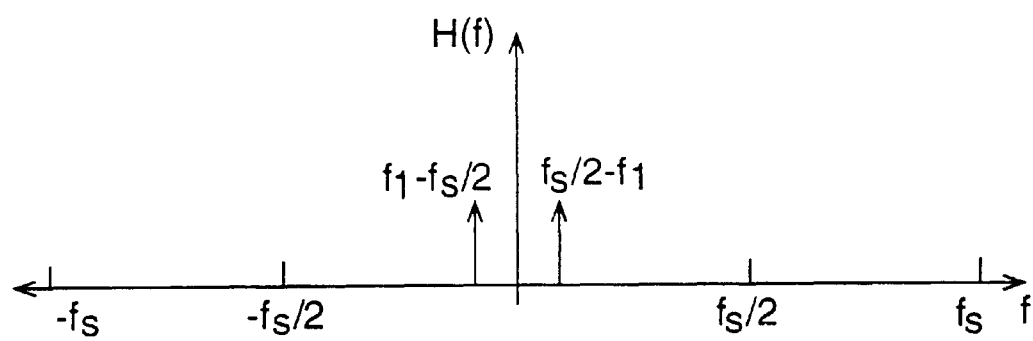
Figure 6D:
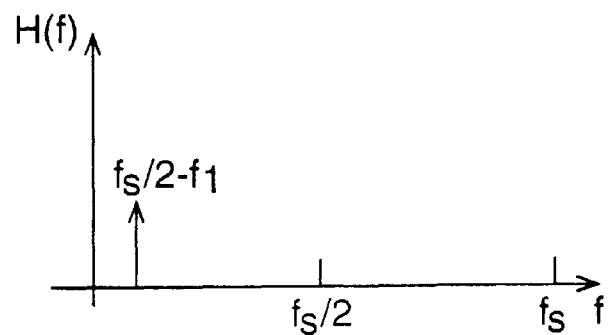

Since a negative frequency can be considered as a positive frequency phase shifted by 180°, the two frequency components of FIG. 6(c) may be added vectorially to give a resultant frequency component of the same frequency $(f_s/2-f_1)$, as illustrated in FIG. 6(d). The frequency component $(f_s/2-f_1)$ is the frequency component $f_1$ of the original discrete time domain signal x(n) frequency translated by $(f_s/2-f_1)$.

Figure 7:
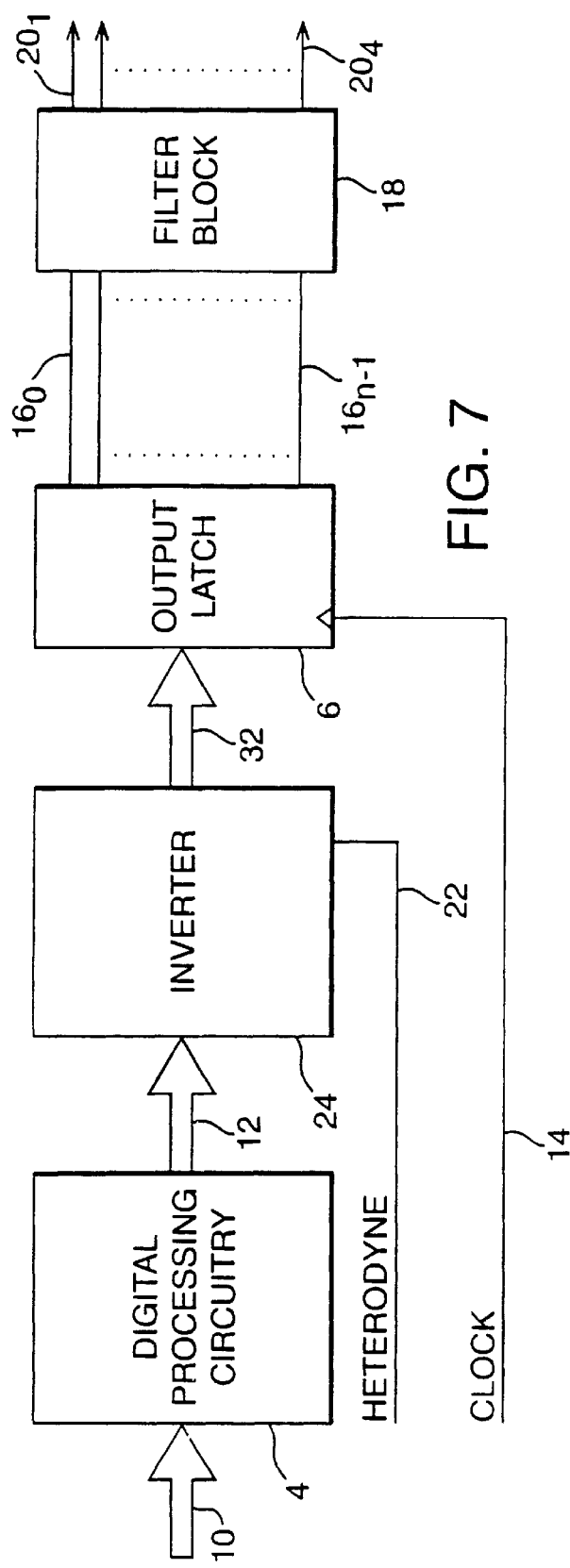
FIG. 7 illustrates the basic elements of part of a signal processing circuit implementing the principles of the present invention.

Thus it has been proven that multiplication in the time domain of a discrete, sampled time domain signal by a discrete vector signal having a frequency of half the sampling frequency results in a frequency translation in the discrete frequency domain. As a result of this frequency translation, a frequency in the upper half of the Nyquist band can be translated to the lower half of the Nyquist band, and a frequency in the lower half of the Nyquist band can be translated to the upper half of the Nyquist band. From inspection of FIG. 6(a) it can be deduced that multiplication of a vector by a discrete vector at half the sampling frequency results in an inversion of every other sample of the original vector. Therefore the multiplication effect described hereinabove can be effected by such inversion. Referring to FIG. 7, there is illustrated an implementation of the receiver circuitry of FIG. 1 according to the present invention. Components in FIG. 7 which are identical to components of FIG. 1 are identified by like reference numerals.

As seen in FIG. 7, the receiver of FIG. 1 is modified by the introduction of an inverter block 24, which is preferably implemented by utilising a negator. The inverter block 24 receives the digital output from the digital processing circuitry 4 on lines 12. The inverter is controlled by a signal HETERODYNE on line 22. If the signal on line 22 is not set, the values on signal lines 12 are presented at the outputs 32 of the inverter in an non-inverted state. If the signal on line 22 is set, the values on signal lines 12 are presented at the outputs 32 of the inverter 24 in an inverted state.

The operation of the inverter 24 to invert the binary values on line 12 responsive to the signal HETERODYNE on line 22 will be well understood by one skilled in the art.

In the receiver of FIG. 7, the filter block 18 has only four outputs $20_1$ to $20_4$ (each comprising n bits) corresponding to four filters in the filter block 18. The receiver can, as will be described hereinafter, still support the eight carrier frequencies of the receiver of FIG. 1.

The receiver of FIG. 7 utilises the fact that the inversion of every other sample of a discrete time signal equates to multiplication, or heterodyning, by a signal at a frequency of half the sampling frequency.

If the received signal has a carrier frequency of $f_{c1}$ to $f_{c4}$, then the signal HETERODYNE on line 22 is not set, and the signal associated with one of the carrier frequencies is presented at one of the outputs 201 to 204 of the output latch 18 as before to the one of the filters having a centre frequency of $f_{c1}$ to $f_{c4}$.

When the carrier frequency has a frequency of $f_{c5}$ to $f_{c8}$ the signal HETERODYNE on line 22 is set on every other sample, and the inverter and adder operate to generate the two's complement of the digital signal representing the carrier frequency on every other sample output from the digital processing circuitry 4. This has the effect of inverting every other sample of the signal thus resulting in the frequency translation from the top half of the Nyquist band to the bottom half of the Nyquist band.

Thus signals having carrier frequencies of $f_{c5}$, $f_{c6}$, $f_{c7}$, $f_{c8}$, are translated to frequencies of $f_{c4}$, $f_{c3}$, $f_{c2}$, $f_{c1}$ respectively, such that they can be filtered by one of the four filters provided in the lower half of the Nyquist band. Thus applying the present invention to translate frequencies from one half of the Nyquist band to the other enables the number of required filters in the receiver to be reduced by one half.

Figure 8:
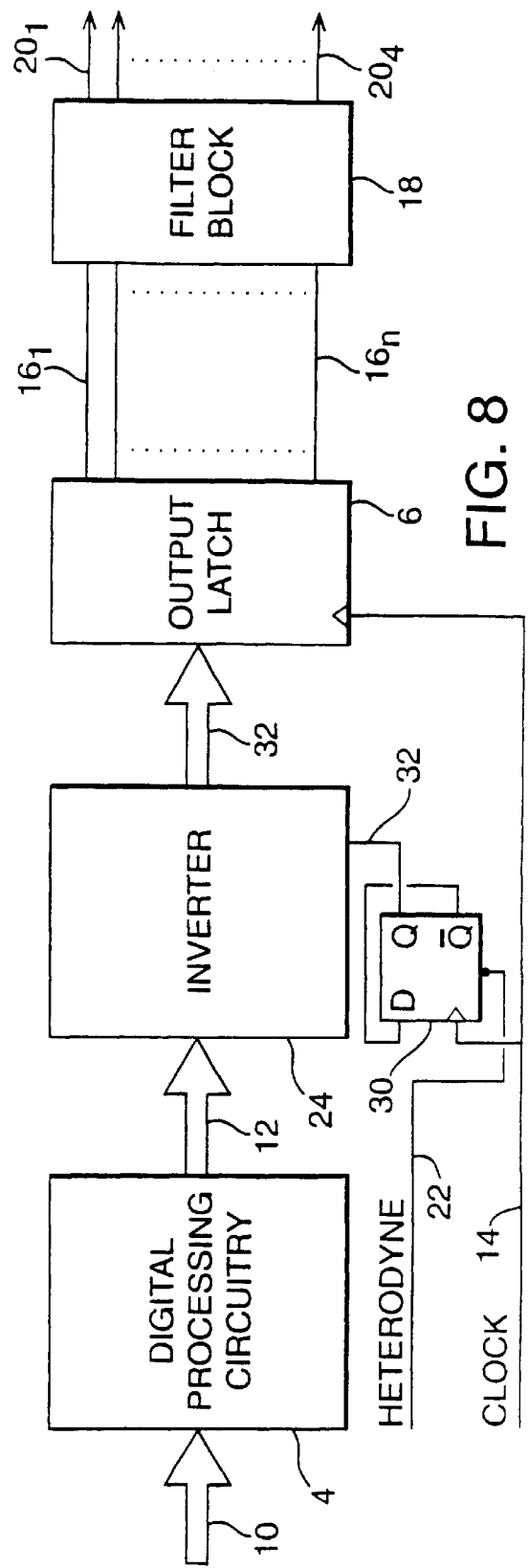
FIG. 8 illustrates the basic elements of a part of an alternative signal processing circuit implementing the principles of the present invention.

FIG. 8 illustrates an efficient modification to the receiver of FIG. 7. There is additionally provided, as shown, a D-type flip-flop 30. The flip-flop 30 is configured to receive the clock signal CLOCK at the clock input thereof. The Q output of the flip-flop forms the input to enable the inverter 24 on line 32. The Qbar output of the flip-flop is connected to the D input of the flip-flop. The flip-flop 30 is configured in toggle mode so that it divides the sample clock (i.e. the clock signal CLOCK) by 2. Thus the signal on line 32 to enable the inverter is set once every two samples. That is, the inverter is enabled every other sample.

The signal Heterodyne supplied to the circuitry could be provided on an external pin of an integrated circuit package. Alternatively the circuitry could include a register containing a flag from which the signal Heterodyne is derived. Setting the flag enables operation of the invention.

It will be appreciated that the receiver could be designed such that the carriers in the bottom half of the Nyquist band are translated to the top half. Alternatively, a more complex arrangement could be implemented in which some frequencies are translated from the bottom half to the top half, and some from the top half to the bottom half, such that filter at the frequencies $f_{c3}$, $f_{c4}$, $f_{c5}$, $f_{c6}$ or at the frequencies $f_{c1}$, $f_{c2}$, $f_{c7}$, $f_{c8}$ are utilised.

The two's complement scheme for achieving the heterodyning is particularly advantageous in a digital receiver since the receiver is already equipped with digital circuitry including priority encoding and latching circuitry. The modification to the architecture of the receiver of FIG. 1 required to realise the necessary frequency translation to implement the invention could be achieved by software control of the existing hardware if necessary.

It will be appreciated that the above-mentioned scheme could be equally applied in a transmitter as in a receiver. The invention can be broadly applied to any signal processing techniques where a number of frequencies are present in both the upper and lower halves of the Nyquist band, to thereby reduce the complexity and cost of the circuitry.

The invention thus provides a systems designer with a means for controlling discrete time frequency translation imposition, by modifying the digital output stage of a generic analogue to digital time domain converter.

What is claimed is:

1. A method of processing a signal, comprising sampling the signal at a sampling frequency thereby generating discrete time components at the sampling interval; and inverting alternate ones of the discrete time components thereby translating a frequency component of the sampled signal in one part of the Nyquist band to another part of the Nyquist band, in which a frequency component in the upper half of the Nyquist band is translated to a lower half of the Nyquist band or a frequency component in the lower half of the Nyquist band is translated to the upper half of the Nyquist band.

2. The method of claim 1 in which the step of inverting alternate ones of the discrete time components comprises multiplying the sampled signal by a reference signal at half the sampling frequency and having discrete time components at the sampling interval.

3. The method of claim 1 further comprising the step of selectively enabling the inverting step.

4. The method of claim 1 in which the inverting step is selectively enabled responsive to the frequency of the sampled signal being in a certain range.

5. The method of processing a plurality of signals of different frequencies according to claim 1, in which each of the plurality of signals has a frequency within the Nyquist band, wherein the step of inverting is carried out selectively for the plurality of sampled signals, whereby the frequency components of selected ones of the signals are translated to another part of the Nyquist band.

6. The method of claim 5 in which those signals having frequencies in the upper half of the Nyquist band are translated to the lower half of the Nyquist band or those signals having frequencies in the lower half of the Nyquist band are translated to the upper half of the Nyquist band.

7. A signal processing circuit comprising an input circuit connected to receive a signal; a sampling circuit connected to the input circuit and for sampling the signal at a sampling frequency to thereby generate discrete time components at the sampling interval; and inverting means connected to receive the sampled output and for inverting alternate ones of the discrete time components, whereby a frequency component of the sampled signal in one part of the Nyquist band is translated to another part of the Nyquist band, in which a frequency component in the upper half of the Nyquist band is translated to a lower half of the Nyquist band and a frequency component in the lower half of the Nyquist band is translated to the upper half of the Nyquist band.

8. The signal processing circuit of claim 7 in which the means for inverting comprises a multiplier connected to multiply the sampled signal by a reference signal at half the sampling frequency and having discrete time components at the sampling interval.

9. The signal processing circuit of claim 7 further comprising a selection circuit for selectively enabling the means for inverting.

10. The signal processing circuit of claim 7 in which the means for inverting is selectively enabled responsive to the frequency of the sampled signal being in a certain range.

11. The signal processing circuit of claim 7 in which the input circuit is connected to receive a plurality of signals having different frequencies, each of the plurality of signals having a frequency within the Nyquist band, wherein the inverting means is enabled selectively such that frequency components of selected ones of the signals are translated to another part of the Nyquist band.

12. The signal processing circuit of claim 11 in which those signals having frequencies in the upper half of the Nyquist band are translated to the lower half of the Nyquist band or those signals having frequencies in the lower half of the Nyquist band are translated to the upper half of the Nyquist band.

* * * * *